United States Patent [19]

Kusaba

[11] Patent Number: 5,019,727
[45] Date of Patent: May 28, 1991

[54] SEMICONDUCTOR INTEGRATED CIRCUIT HAVING A DECODING AND LEVEL SHIFTING FUNCTION

[75] Inventor: Kazuyuki Kusaba, Tokyo, Japan
[73] Assignee: NEC Corporation, Japan
[21] Appl. No.: 453,607
[22] Filed: Dec. 20, 1989

[30] Foreign Application Priority Data

Dec. 20, 1988 [JP] Japan ................. 63-322504

[51] Int. Cl.⁵ ................. H03K 19/094; H03K 19/017; H03K 17/687; H03K 17/04
[52] U.S. Cl. ................. 307/449; 307/451; 307/475; 307/448
[58] Field of Search ............ 307/443, 448, 463, 449, 307/451, 475, 576, 579, 585, 270

[56] References Cited

U.S. PATENT DOCUMENTS

| | | | |
|---|---|---|---|
| 4,581,548 | 4/1986 | Young | 307/449 |
| 4,620,116 | 10/1986 | Ozawa | 307/449 |
| 4,798,977 | 1/1989 | Sakui et al. | 307/449 X |
| 4,866,305 | 9/1989 | Hasegawa | 307/449 |

Primary Examiner—Stanley D. Miller
Assistant Examiner—David R. Bertelson
Attorney, Agent, or Firm—Ostrolenk, Faber, Gerb & Soffen

[57] ABSTRACT

A decoding and level shifting circuit comprises first and second n-channel transistors each having a source connected to a high negative potential, a gate and a drain of the first n-channel transistor being connected to a drain and a gate of the second n-channel transistor, respectively. A first group of p-channel transistors are connected in parallel between the drain of the first n-channel transistor and a ground level, and gates of the first group of p-channel transistors are connected to receive a first group of signals, respectively. A second group of p-channel transistors are connected in series between the drain of the second n-channel transistor and the ground level, and gates of the second group of p-channel transistors are connected to respectively receive a second group of signals complementary to the first group of signals. The drain of the second n-channel transistor gives an output.

5 Claims, 2 Drawing Sheets

SEMICONDUCTOR INTEGRATED CIRCUIT HAVING A DECODING AND LEVEL SHIFTING FUNCTION

BACKGROUND OF THE INVENTION

1. Field of the Invention

The present invention relates to a semiconductor integrated circuit, and more specifically to a semiconductor integrated circuit having a decoding function and a level shifting function.

2. Description of Related Art

Conventionally, a so-called level shifter has been often used in combination with a decoder, in a level conversion circuit associated with a driver for a liquid crystal display or a fluorescent indicator tube.

Referring to FIG. 1, there is shown a typical conventional circuit having a two-input decoder, a level conversion circuit and a display driver. In the shown circuit, a logic circuit 10 has a high level corresponding to a ground potential and a low level corresponding to an ordinary power supply voltage. The logic circuit is connected to receive an enable signal 12 and a pair of input signals 14 and 16. The enable signal 12 is supplied to all four three-input NAND gates 18, 20, 22 and 24. A first input signal 14 is supplied directly to the NAND gates 20 and 24 and through an inverter 36 to the NAND gates 18 and 22, and a second input signal 16 is supplied directly to the NAND gates 22 and 24 and through an inverter 38 to the NAND gates 18 and 20.

Outputs of the NAND gates 18, 20, 22 and 24 are coupled to four inverters 40, 42, 44 and 46, respectively, which are also coupled at their output to four level shifters 48, 50, 52 and 54, respectively. Outputs of the level shifters 48, 50, 52 and 54 are connected to four drivers 56, 58, 60 and 62 for a liquid crystal display or a fluorescent indicator tube, respectively. In the above mentioned circuit, the four NAND gates 18 to 24 and the inverters 40 to 46 form a decoder 64.

With the above mentioned circuit, when the enable signal 12 is at a high level, one of the NAND gates 18 to 24 determined by the pair of input signals 14 and 16 is activated to generate a low level signal, which is inverted by the associated inverter so that a high level signal is supplied to the corresponding level shifter. On the other hand, the other three NAND gates are inactive, and therefore, generate a high level signal, which is inverted by the associated inverter so that a low level signal is applied to the corresponding level shifter.

However, when the enable signal 12 is at a low level, all of the NAND gates 18 to 24 are inactive to generate a high level signal, and therefore, low level signals generated by the associated inverters are supplied to all the level shifters 48 to 54, respectively.

Turning to FIG. 2, there is shown a circuit diagram of one typical example of a conventional level shifter. The shown level shifter includes a p-channel transistor 66 having a gate connected to receive an input signal 68 and a source connected to the ground, and another p-channel transistor 70 having a source connected to the ground and a gate connected to receive a signal 72 complementary to the input signal 68. A drain of the first p-channel transistor 66 is connected to a drain of an n-channel transistor 74 and a gate of another n-channel transistor 76, respectively. A drain of the second p-channel transistor 70 is connected to a drain of the second n-channel transistor 76 and a gate of the first n-channel transistor 74, respectively. Sources of the two n-channel transistors 74 and 76 are connected to a negative high potential $V_H$ which is different from the ordinary power supply voltage, and a connection node between the p-channel transistor 70 and the n-channel transistor 76 forms an output 78.

Now, if the input signal 68 is at a high level, the p-channel transistor 66 is off, and on the other hand, since the low level signal complementary to the input signal 68 is applied to the gate of the p-channel transistor 70, the p-channel transistor 70 is on. Accordingly, the gate of the n-channel transistor 74 is applied with a high level signal (corresponding to a level of the ground GND), so that the n-channel transistor 74 is turned on. On the other hand, the gate of the n-channel transistor 76 is applied with a low level signal (corresponding to a level of the high negative voltage $V_H$), so that the n-channel transistor 76 is turned off. As a result, the high level signal corresponding to the ground level GND is supplied from the output 78.

Conversely, if the input signal 68 is at the low level, the p-channel transistor 66 is on, and the p-channel transistor 70 is off. Therefore, the n-channel transistor 74 is off and the n-channel transistor 76 is on. As a result, the low level signal corresponding to the level of the high negative voltage $V_H$ is supplied from the output 78.

The output signal 78 of the level shifter is applied to a driver for a liquid crystal display or a fluorescent indicator tube.

For example, in the circuit shown in FIG. 1, when the enable signal 12 is at the high level, if the input signals 14 and 16 are "0" and "0", respectively, the output jof only the three-input NAND gate 18 is activated so that the associated inverter 40 generates the high level signal to the corresponding level shifter 48. As a result, the level shifter 48 outputs the high level signal to the display driver 56. On the other hand, the other three-input NAND gates 20, 22 ad 24 are maintained inactive, and therefore, the inverters 42, 44 and 46 outputs the low level signals, so that the outputs of the corresponding level shifters 50, 52 and 54 are brought to the high negative voltage corresponding to the low level.

Thus, the signal having the high level corresponding to the ground level and the low level corresponding to the ordinary power supply voltage, is level-converted by the level shifter to the signal having the high level corresponding to the ground level and the low level corresponding to the negative high potential $V_H$ which is different from the ordinary power supply voltage.

The above mentioned level shifter operates to level-convert the decoded signal outputted from the decoder used in combination with the level shifter. If this circuit arrangement is formed in a semiconductor integrated circuit, the larger the number of input signals becomes, the larger the number of circuit elements becomes, and the larger the required layout area becomes. Accordingly, not only the design cost is increased, but also the manufacturing yield is decreased.

SUMMARY OF THE INVENTION

Accordingly, it is an object of the present invention to provide a semiconductor integrated circuit which has overcome the above mentioned defect of the conventional one.

Another object of the present invention is to provide a decoding and level shifting circuit which can be assembled in a semiconductor integrated circuit with a decreased manufacturing cost and an increased manufacturing yield.

A further object of the present invention is to provide a decoding and level shifting circuit which can be composed of a decreased number of circuit elements and which has not only level shifting function but also a decoding function.

The above and other objects of the present invention are achieved in accordance with the present invention by a decoding and level shifting circuit comprising first and second transistors of a first conduction type each having a source connected to a first potential corresponding to a low level, a gate and a drain of one transistor of the first and second transistors being connected to a drain and a gate of the other transistor of the first and second transistors, respectively, a first group of transistors of a second conduction type different from the first conduction type, the first group of transistors being connected in parallel between the drain of the first transistor and a second potential corresponding to a high level, gates of the first group of transistors being connected to receive a first group of signals, respectively, and a second group of transistors of the second conduction type connected in series between the drain of the second transistor and the second potential, gates of the second group of transistors being connected to respectively receive a second group of signals complementary to the first group of signals, the drain of the second transistor giving an output.

With the above mentioned arrangement, since the first and second transistors are cross-connected to each other, if all of the first group of transistors are turned off and all of the second group of transistors are turned on, the drain of the second transistor outputs a high level signal corresponding to the second potential. On the other hand, if at least one of the first group of transistors is turned on and at least one of the second group of transistors is turned off, the drain of the second transistor outputs a low level signal corresponding to the first potential. Thus, the high level signal corresponding to the second potential or the low level signal corresponding to the first potential is alternatively outputted in accordance with the first group of signals.

According to another aspect of the present invention, there is provided a decoding and level shifting circuit receiving an enable signal and a pair of input signals for generating four level-shifted output signals, comprising an input logic circuit connected to receive the enable signal and the plurality of input signals for generating complementary signals corresponding to the enable signal and the plurality of input signals, and four decoding and level shifting units each receiving the enable signal and the plurality of input signals and their complementary signals and for generating one of the four level-shifted output signals, each of the decoding and level shifting units including first and second n-channel transistors each having a source connected to a high negative potential, a gate and a drain of the first n-channel transistor being connected to a drain and a gate of the second n-channel transistor, respectively, first, second and third p-channel transistors connected in parallel between the drain of the first n-channel transistor and a ground level, gates of the first, second and third p-channel transistors being connected to respectively receive a first group of signals including one of the enable signal and its complementary signal, one of the first input signal and its complementary signal, and one of the second input signal and its complementary signal, and fourth, fifth and sixth p-channel transistors connected in series between the drain of the second n-channel transistor and the ground level, gates of the fourth, fifth and sixth p-channel transistors being connected to respectively receive a second group of signals including the other of the enable signal and its complementary signal, the other of the first input signal and its complementary signal and the other of the second input signal and its complementary signal, the drain of the second n-channel transistor giving an output.

The above and other objects, features and advantages of the present invention will be apparent from the following description of a preferred embodiment of the invention with reference to the accompanying drawings.

DESCRIPTION OF THE PREFERRED EMBODIMENT

Figure 3:
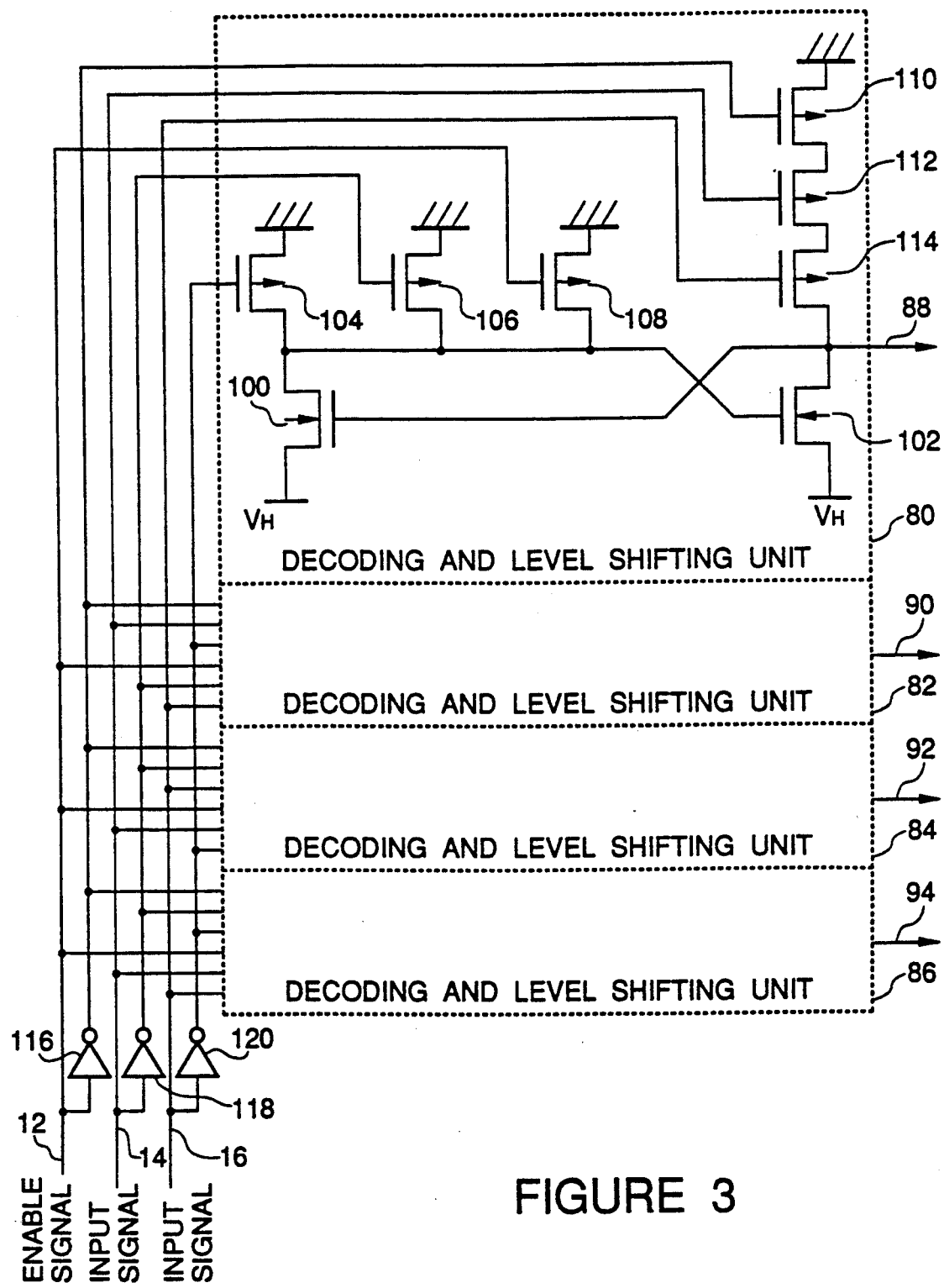
FIG. 3 is a circuit diagram of an embodiment of the level shift circuit in accordance with the present invention.

Referring to FIG. 3, there is shown a circuit diagram of an embodiment of the level shift circuit in accordance with the present invention. The shown level shift circuit are constructed to receive one enable signal 12 and a pair of input signals 14 and 16, similarly to the circuit shown in FIG. 1, and has four decoding and level shifting units 80, 82, 84 and 86 for generating level-shifted output signals 88, 90, 92 and 94, respectively. These decoding and level shifting units 80, 82, 84 and 86 have the same circuit construction, but are different in a pattern of connection for receiving the enable signal 12, the input signals 14 and 16 and their complementary signals. Therefore, only the decoding and level shifting unit 80 will be explained in the following.

The decoding and level shifting unit 80 has a pair of n-channel transistors 100 and 102 each having a source connected to a high negative voltage $V_H$. A drain and a gate of the transistor 100 are connected to a gate and a drain of the transistor 102, respectively, so that the transistors 100 and 102 form a basic differential circuit. Three p-channel transistors 104, 106 and 108 are connected in parallel between the drain of the transistor 100 and a ground level GND in such a manner that drains of the transistors 104, 106 and 108 are connected commonly to the drain of the transistor 100 and a source of each of the transistors 104, 106 and 108 is connected to the ground level GND. In addition, three p-channel transistors 110, 112 and 114 are connected in series between the drain of the transistor 102 and the ground level GND in such a manner that the drain of the transistor 102 is connected to a drain of the transistor 114, whose source is connected to a drain of the transistor 112, whose source is connected to a drain of the transistor 110, whose source is connected to the ground level GND. A connection node between the drain of the transistor 102 and the drain of the transistor 114 is connected to the output 88.

The enable signal 12 is supplied directly to the gate of the transistor 108 and through an inverter 116 to the gate of the transistor 110. The first input signal 14 is supplied directly to the gate of the transistor 112 and through an inverter 118 to the gate of the transistor 106. The second input signal 16 is supplied directly to the gate of the transistor 114 and through an inverter 120 to the gate of the transistor 104.

When the enable signal 12 is at a high level, if the input signals 14 and 16 are "0" and "0", respectively, all the p-channel transistors 110, 112 and 114 are turned on, and all the p-channel transistors 104, 106 and 108 are turned off. Therefore, the n-channel transistor 100 is turned on and the n-channel transistor 102 is turned off, so that the output 88 is brought to the high level. Namely, the decoding and level shifting unit 80 is rendered active.

In the other decoding and level shifting units 82, 84 and 86, on the other hand, at least one of the series-connected p-channel transistors 110, 112 and 114 are turned off, and at least one of the parallel-connected p-channel transistors 104, 106 and 108 are turned on, so that the outputs 90, 92 and 94 are brought to the low level. Namely, the decoding and level shifting units 82, 84 and 86 are rendered inactive.

In the above mentioned embodiment, the two-input decoder has been realized. However, it is possible to realize a decoder having three or more inputs by correspondingly increasing the number of the series-connected p-channel transistors and the number of the parallel-connected p-channel transistors, respectively.

As seen from the above, in the level shifter constructed in accordance with the present invention, the decoder and the level shifting circuit are realized in combination by a simple transistor circuit, which can be formed in a semiconductor integrated circuit. Even if the number of input signals becomes large, the more the number of required circuit elements can be decreased remarkably in comparison with the conventional one as shown in FIG. 1, and therefore, the smaller the required layout area becomes in comparison with the conventional one.

Figure 1:
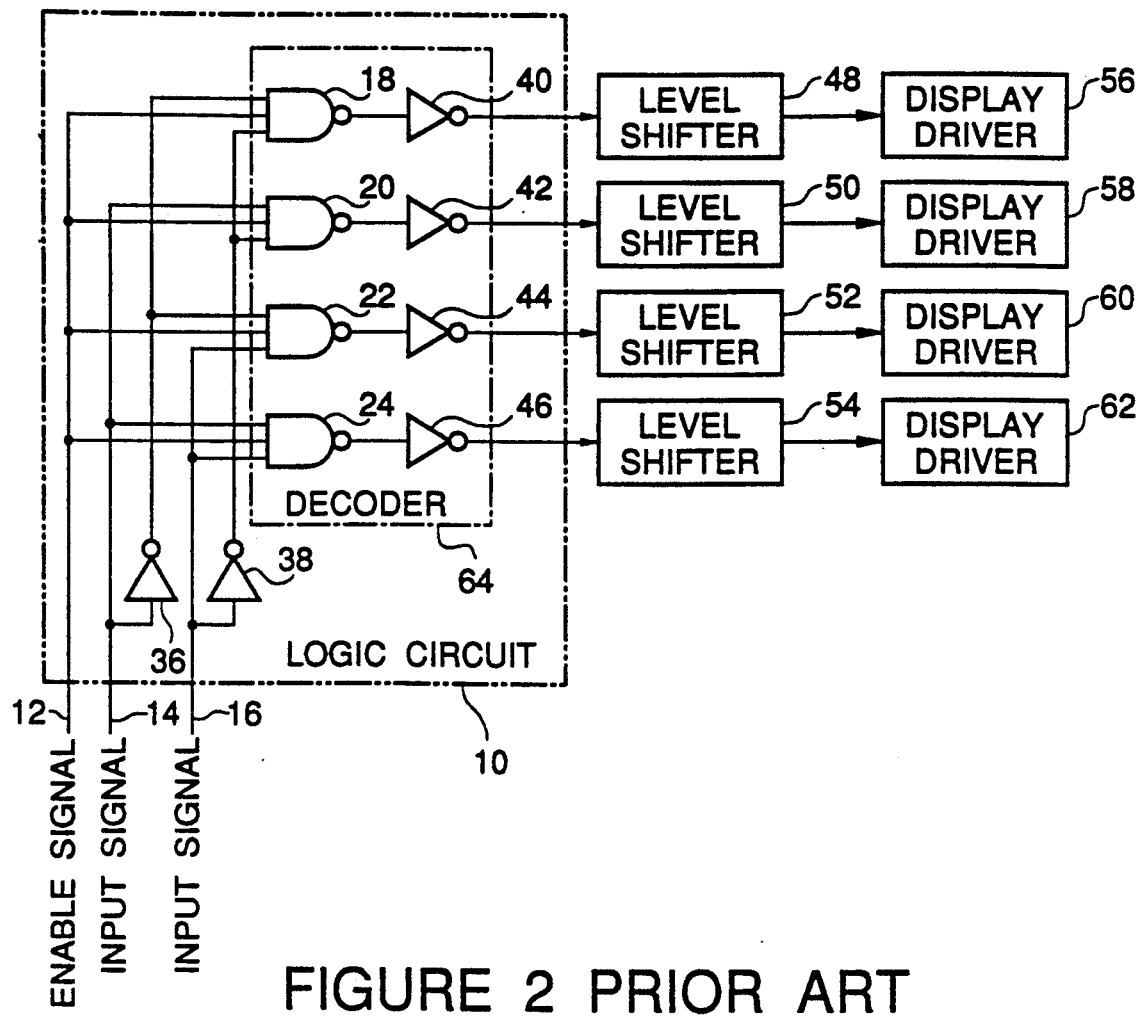
FIG. 1 is a circuit diagram of a typical conventional circuit including a decoder, a level conversion circuit and a display driver.
Figure 2:
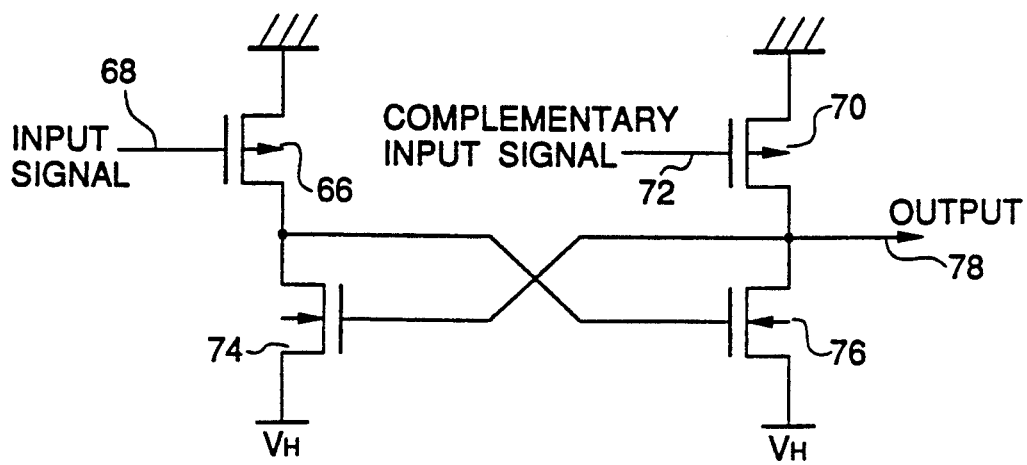
FIG. 2 is a circuit diagram of a typical conventional level shifter.

For example, in the decoder and the level shifter for processing two inputs, the circuit shown in FIG. 1 is composed of 52 circuit elements, and on the other hand, the circuit shown in FIG. 3 can be composed of 38 circuit elements. Similarly, in the case of three inputs, the circuit shown in FIG. 1 is composed of 118 circuit elements, and on the other hand, the circuit shown in FIG. 3 can be composed of 88 circuit elements.

Therefore, the level shifter in accordance with the present invention is advantageous over the conventional one in that the level shifter can be composed of a decreased number of circuit elements and can be formed in a semiconductor integrated circuit with a decreased manufacturing cost and an increased manufacturing yield.

The invention has thus been shown and described with reference to the specific embodiment. However, it should be noted that the present invention is in no way limited to the details of the illustrated structure but changes and modifications may be made within the scope of the appended claims.

I claims:

1. A decoding and level shifting circuit comprising first and second transistors of a first conduction type each having a source connected to a first potential corresponding to a low level, a gate and a drain of one transistor of the first and second transistors being connected to a drain and a gate of the other transistor of the first and second transistors, respectively, a first group of transistors of a second conduction type different from the first conduction type, the first group of transistors being connected in parallel between the drain of the first transistor and a second potential corresponding to a high level, gates of the first group of transistors being connected to receive a first group of signals, respectively, and a second group of transistors of the second conduction type connected in series between the drain of the second transistor and the second potential, gates of the second group of transistors being connected to respectively receive a second group of signals complementary to the first group of signals, the drain of the second transistor giving an output.

2. A decoding and level shifting circuit claimed in claim 1 wherein the first potential is a ground level and the second potential is a high negative potential, and wherein the first and second transistors are of n-channel type and the transistors of the first and second groups are of p-channel type.

3. A decoding and level shifting circuit claimed in claim 1 further including an input circuit receiving an enable signal and a plurality of input signals for generating the first group of signals corresponding to the enable signal and the plurality of input signals, respectively, and the second group corresponding to the enable signal and the plurality of input signals, respectively, but complementary to corresponding ones of the first group of signals.

4. A decoding and level shifting circuit receiving an enable signal and a pair of input signals for generating four level-shifted output signals, comprising an input logic circuit connected to receive the enable signal and the plurality of input signals for generating complementary signals corresponding to the enable signal and the plurality of input signals, and four decoding and level shifting units each receiving the enable signal and the plurality of input signals and their complementary signals and for generating one of the four level-shifted output signals, each of the decoding and level shifting units including first and second n-channel transistors each having a source connected to a high negative potential, a gate and a drain of the first n-channel transistor being connected to a drain and a gate of the second n-channel transistor, respectively, first, second and third p-channel transistors connected in parallel between the drain of the first n-channel transistor and a ground level, gates of the first, second and third p-channel transistors being connected to respectively receive a first group of signals including one of the enable signal and its complementary signal, one of the first input signal and its complementary signal, and one of the second input signal and its complementary signal, and fourth, fifth and sixth p-channel transistors connected in series between the drain of the second n-channel transistor and the ground level, gates of the fourth, fifth and sixth p-channel transistors being connected to respectively receive a second group of signals including the other of the enable signal and its complementary signal, the other of the first input signal and its complementary signal, and the other of the second input signal and its complementary signal, the drain of the second n-channel transistor giving an output.

5. A decoding and level shifting circuit comprising first and second n-channel transistors each having a source connected to a high negative potential, a gate and a drain of the first n-channel transistor being connected to a drain and a gate of the second n-channel transistor, respectively, a first group of p-channel transistors connected in parallel between the drain of the first n-channel transistor and a ground level, gates of the first group of p-channel transistors being connected to receive a first group of signals, respectively, and a second group of p-channel transistors are connected in series between the drain of the second n-channel transistor and the ground level, gates of the second group of p-channel transistors being connected to respectively receive a second group of signals complementary to the first group of signals, the drain of the second n-channel transistor giving an output.

* * * * *

REEXAMINATION CERTIFICATE (1775th)
United States Patent [19]
Kusaba

[11] B1 5,019,727
[45] Certificate Issued Aug. 18, 1992

[54] SEMICONDUCTOR INTEGRATED CIRCUIT HAVING A DECODING AND LEVEL SHIFTING FUNCTION

[75] Inventor: Kazuyuki Kusaba, Tokyo, Japan

[73] Assignee: NEC Corporation

Reexamination Request:
No. 90/002,564, Jan. 31, 1992

Reexamination Certificate for:
Patent No.: 5,019,727
Issued: May 28, 1991
Appl. No.: 453,607
Filed: Dec. 20, 1989

[30] Foreign Application Priority Data
Dec. 20, 1988 [JP] Japan .................. 63-322504

[51] Int. Cl.⁵ .............. H03K 19/094; H03K 19/017; H03K 17/687; H03K 17/04
[52] U.S. Cl. .................. 307/449; 307/448; 307/451; 307/475
[58] Field of Search ............ 307/443, 449, 463, 451, 307/448, 475

[56] References Cited
U.S. PATENT DOCUMENTS

| | | | |
|---|---|---|---|
| 4,581,548 | 4/1986 | Young | 307/449 |
| 4,620,116 | 10/1986 | Ozawa | 307/449 |
| 4,798,977 | 1/1989 | Sakui et al. | 307/449 X |
| 4,866,305 | 9/1989 | Hasegawa | 307/449 |

*Primary Examiner*—John S. Heyman

[57] ABSTRACT

A decoding and level shifting circuit comprises first and second n-channel transistors each having a source connected to a high negative potential, a gate and a drain of the first n-channel transistor being connected to a drain and a gate of the second n-channel transistor, respectively. A first group of p-channel transistors are connected in parallel between the drain of the first n-channel transistor and a ground level, and gates of the first group of p-channel transistors are connected to receive a first group of signals, respectively. A second group of p-channel transistors are connected in series between the drain of the second n-channel transistor and the ground level, and gates of the second group of p-channel transistors are connected to respectively receive a second group of signals complementary to the first group of signals. The drain of the second n-channel transistor gives an output.

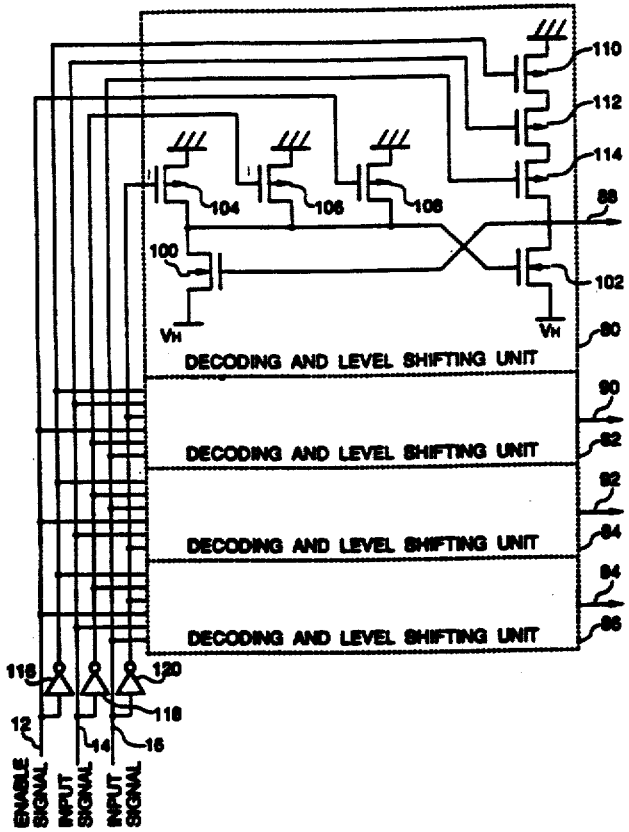

REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claim(s) 1–5 is confirmed.

* * * * *